(12) United States Patent
Tanaka et al.

(10) Patent No.: US 10,722,980 B2
(45) Date of Patent: Jul. 28, 2020

(54) LASER PROCESSING APPARATUS

(71) Applicant: DISCO CORPORATION, Tokyo (JP)

(72) Inventors: Kohei Tanaka, Tokyo (JP); Hidetoshi Mannami, Tokyo (JP); Hisatoshi Fujisawa, Tokyo (JP); Hiroshi Nomura, Tokyo (JP); Wakana Onoe, Tokyo (JP); Taiki Sawabe, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 52 days.

(21) Appl. No.: 15/270,610

(22) Filed: Sep. 20, 2016

(65) Prior Publication Data

US 2017/0087671 A1    Mar. 30, 2017

(30) Foreign Application Priority Data

Sep. 29, 2015   (JP) .................................. 2015-191941

(51) Int. Cl.
    *B23K 26/38*    (2014.01)
    *H01L 21/67*    (2006.01)
    (Continued)

(52) U.S. Cl.
    CPC .......... *B23K 26/38* (2013.01); *B23K 26/0006* (2013.01); *B23K 26/064* (2015.10);
    (Continued)

(58) Field of Classification Search
    CPC .................................................. B23K 26/40;
    B23K 2203/50; B23K 26/0853; B23K 2201/40; B23K 26/0673;
    (Continued)

(56) References Cited

U.S. PATENT DOCUMENTS

| | | | | |
|---|---|---|---|---|
| 4,653,903 A | * | 3/1987 | Torigoe | G03F 7/70991 355/53 |
| 2004/0089644 A1 | * | 5/2004 | Sekiya | H01L 21/78 219/121.72 |

(Continued)

FOREIGN PATENT DOCUMENTS

| | | | |
|---|---|---|---|
| JP | 2008110383 A | | 5/2008 |
| JP | 2010-158691 | | 7/2010 |
| JP | 2011187481 A | * | 9/2011 |

OTHER PUBLICATIONS

English translation of foreign patent JP 2011187481 A.*
Onoe, Wakana et al., U.S. Appl. No. 15/278,717, filed Sep. 28, 2016.

*Primary Examiner* — Serkan Akar
*Assistant Examiner* — Chris Q Liu
(74) *Attorney, Agent, or Firm* — Greer Burns & Crain, Ltd.

(57) ABSTRACT

Disclosed herein is a laser processing apparatus including first and second laser mechanisms, a laser oscillator for oscillating an original laser beam, an optical system for branching the original laser beam into first and second laser beams, and first and second operation panels for respectively setting first and second processing conditions for the first and second laser mechanisms. The first and second laser mechanisms include first and second chuck tables for holding first and second workpieces, first and second X moving units for moving the first and second chuck tables in an X direction, first and second Y moving units for moving the first and second chuck tables in a Y direction perpendicular to the X direction, and first and second focusing units for focusing the first and second laser beams to the first and second workpieces held on the first and second chuck tables, respectively.

9 Claims, 10 Drawing Sheets

(51) Int. Cl.
*B23K 26/359* (2014.01)
*B23K 26/00* (2014.01)
*H01L 21/673* (2006.01)
*H01L 21/68* (2006.01)
*H01L 21/687* (2006.01)
*B23K 26/064* (2014.01)
*B23K 26/06* (2014.01)
*B23K 26/067* (2006.01)
*B23K 26/08* (2014.01)
*H01L 21/677* (2006.01)
*H01L 21/78* (2006.01)
*B32B 15/01* (2006.01)
*B23K 101/40* (2006.01)
*B23K 103/00* (2006.01)

(52) U.S. Cl.
CPC ...... *B23K 26/0626* (2013.01); *B23K 26/0673* (2013.01); *B23K 26/0853* (2013.01); *B23K 26/359* (2015.10); *B32B 15/011* (2013.01); *H01L 21/6719* (2013.01); *H01L 21/6773* (2013.01); *H01L 21/67115* (2013.01); *H01L 21/67346* (2013.01); *H01L 21/67772* (2013.01); *H01L 21/67778* (2013.01); *H01L 21/68* (2013.01); *H01L 21/68707* (2013.01); *H01L 21/68714* (2013.01); *H01L 21/78* (2013.01); *B23K 2101/40* (2018.08); *B23K 2103/56* (2018.08)

(58) Field of Classification Search
CPC .............. B23K 26/0676; B23K 26/364; B23K 2103/50; B23K 26/042; B23K 26/067; H01L 21/78
USPC ............ 219/121.67, 121.75, 121.68, 121.72, 219/121.78, 121.73, 121.6, 121.61, 219/121.82, 121.83, 121.62, 121.7, 219/121.84, 121.71, 121.74, 121.76, 219/121.77, 121.8, 121.81, 121.85
See application file for complete search history.

(56) References Cited

U.S. PATENT DOCUMENTS

| | | | |
|---|---|---|---|
| 2010/0317172 A1* | 12/2010 | Morikazu | B23K 26/0608 438/463 |
| 2011/0228073 A1* | 9/2011 | Lee | G02B 27/58 348/80 |
| 2011/0233178 A1* | 9/2011 | Cheng | B23K 26/0673 219/121.72 |
| 2013/0240494 A1 | 9/2013 | Nomaru et al. | |

* cited by examiner

LASER PROCESSING APPARATUS

BACKGROUND OF THE INVENTION

Field of the Invention

The present invention relates to a laser processing apparatus for processing a workpiece such as a semiconductor wafer by applying a laser beam thereto.

Description of the Related Art

In a process of manufacturing a plurality of semiconductor device chips by using a laser processing apparatus, a plurality of crossing division lines are formed on the front side of a substantially disk-shaped semiconductor wafer to thereby define a plurality of separate regions where a plurality of semiconductor devices such as integrated circuits (ICs) and large scale integration (LSI) circuits are each formed. The semiconductor wafer is cut along the division lines by applying a laser beam to thereby divide the regions where the semiconductor devices are formed from each other, thus obtaining the individual semiconductor device chips.

The laser processing apparatus includes a chuck table for holding a workpiece, laser beam applying means for applying a laser beam to the workpiece held on the chuck table, and feeding means for feeding the chuck table, wherein the laser beam applying means includes a laser oscillator for oscillating a laser beam, focusing means for focusing the laser beam oscillated by the laser oscillator to thereby apply the focused laser beam to the workpiece held on the chuck table, and an attenuator provided between the laser oscillator and the focusing means for adjusting the power of the laser beam, thereby performing desired laser processing to the workpiece (see Japanese Patent Laid-open No. 2010-158691, for example).

Further, in many cases, the laser oscillator used in the laser processing apparatus is so designed as to oscillate a laser beam having a relatively large power for the purpose of supporting various kinds of processing. Accordingly, the attenuator is generally used to adjust the power of the laser beam to a reduced power suitable for the workpiece.

SUMMARY OF THE INVENTION

As described above, the laser beam generated from the laser oscillator in the laser processing apparatus is used after adjusting the power of the laser beam to a reduced power. For example, ½ or less of the power that can be originally exhibited by the laser oscillator is used for laser processing of the workpiece. In this case, ½ or more of the power of the laser beam oscillated by the laser oscillator is wasted. Thus, the performance of the laser oscillator cannot be sufficiently exhibited to cause poor economy.

It is therefore an object of the present invention to provide a laser processing apparatus which can sufficiently exhibit the performance of a laser oscillator capable of oscillating a laser beam having a large power.

In accordance with an aspect of the present invention, there is provided a laser processing apparatus including a first laser mechanism including a first chuck table for holding a first workpiece, first X moving means for moving the first chuck table in an X direction, first Y moving means for moving the first chuck table in a Y direction perpendicular to the X direction, and first focusing means for focusing a first laser beam to the first workpiece held on the first chuck table; a second laser mechanism including a second chuck table for holding a second workpiece, second X moving means for moving the second chuck table in the X direction, second Y moving means for moving the second chuck table in the Y direction, and second focusing means for focusing a second laser beam to the second workpiece held on the second chuck table; a laser oscillator for oscillating an original laser beam; an optical system for branching the original laser beam oscillated by the laser oscillator into the first laser beam and the second laser beam and leading the first and second laser beams to the first and second focusing means, respectively; a first operation panel for setting first processing conditions for the first laser mechanism; and a second operation panel for setting second processing conditions for the second laser mechanism.

Preferably, the laser processing apparatus further includes a housing for covering the first laser mechanism and the second laser mechanism; the housing being provided with a first door at a position where the first workpiece is loaded to the first laser mechanism and a second door at a position where the second workpiece is loaded to the second laser mechanism; the first and second operation panels being mounted on the first and second doors, respectively; the first door and the second door being arranged in parallel in the Y direction on a plane perpendicular to the X direction.

Preferably, the first chuck table is moved by the first X moving means between a first standby area where the first workpiece is held or upheld with respect to the first chuck table and a first processing area where the first laser beam is applied from the first focusing means to the first workpiece held on the first chuck table; the first standby area including a first cassette table for mounting a first cassette storing the first workpiece, first temporary setting means for temporarily setting the first workpiece, first handling means for taking the first workpiece out of the first cassette mounted on the first cassette table and then carrying the first workpiece to the first temporary setting means, and first transfer means for transferring the first workpiece from the first temporary setting means to the first chuck table; the first door being opened in loading/unloading the first cassette to/from the first cassette table; and the second chuck table is moved by the second X moving means between a second standby area where the second workpiece is held or upheld with respect to the second chuck table and a second processing area where the second laser beam is applied from the second focusing means to the second workpiece held on the second chuck table; the second standby area including a second cassette table for mounting a second cassette storing the second workpiece, second temporary setting means for temporarily setting the second workpiece, second handling means for taking the second workpiece out of the second cassette mounted on the second cassette table and then carrying the second workpiece to the second temporary setting means, and second transfer means for transferring the second workpiece from the second temporary setting means to the second chuck table; the second door being opened in loading/unloading the second cassette to/from the second cassette table.

According to the laser processing apparatus of the present invention, the power of the single laser oscillator is branched to configure the two laser mechanisms. That is, substantially two laser processing apparatuses can be provided. Further, the first and second operation panels for operating the first and second laser mechanisms are provided so as to respectively correspond to the first and second laser mechanisms. Accordingly, the performance of the laser oscillator can be sufficiently exhibited and two kinds of laser processing can be performed simultaneously, so that good economy can therefore be attained. Further, since the laser oscillator for oscillating a laser beam is expensive, the cost of the laser processing apparatus can be reduced to substantially the half.

Further, in the laser processing apparatus of the present invention, the first operation panel is mounted on the first door, and the second operation panel is mounted on the second door. The first door and the second door are arranged in parallel in the Y direction on a plane perpendicular to the X direction. With this arrangement, the two laser mechanisms can be operated efficiently by the two operation panels, respectively.

Further, the first chuck table is moved by the first X moving means between a first standby area where the first workpiece is held or upheld with respect to the first chuck table and a first processing area where the first laser beam is applied from the first focusing means to the first workpiece held on the first chuck table, wherein the first standby area includes a first cassette table for mounting a first cassette storing the first workpiece, first temporary setting means for temporarily setting the first workpiece, first handling means for taking the first workpiece out of the first cassette mounted on the first cassette table and then carrying the first workpiece to the first temporary setting means, and first transfer means for transferring the first workpiece from the first temporary setting means to the first chuck table. Further, the first door is opened in loading/unloading the first cassette to/from the first cassette table. Similarly, the second chuck table is moved by the second X moving means between a second standby area where the second workpiece is held or upheld with respect to the second chuck table and a second processing area where the second laser beam is applied from the second focusing means to the second workpiece held on the second chuck table, wherein the second standby area includes a second cassette table for mounting a second cassette storing the second workpiece, second temporary setting means for temporarily setting the second workpiece, second handling means for taking the second workpiece out of the second cassette mounted on the second cassette table and then carrying the second workpiece to the second temporary setting means, and second transfer means for transferring the second workpiece from the second temporary setting means to the second chuck table. Further, the second door is opened in loading/unloading the second cassette to/from the second cassette table. Accordingly, there is no possibility that when the first door is in an open condition in loading the first cassette to the first cassette table, an operator may erroneously operate the first operation panel to start the first laser mechanism. Also in the case where the second door is in an open condition, a similar effect can be obtained.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
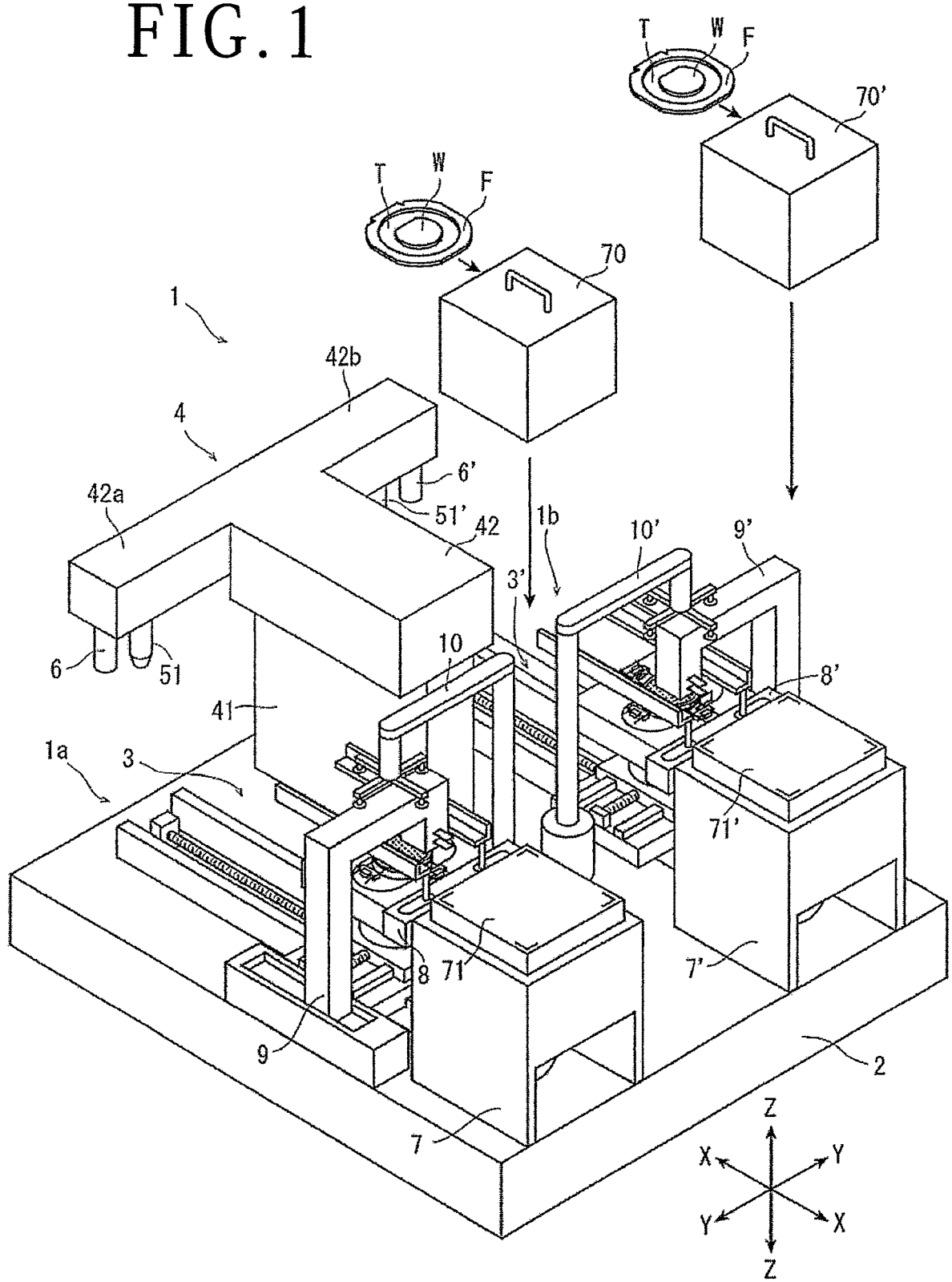
FIG. 1 is a perspective view of a laser processing apparatus according to a preferred embodiment of the present invention.

A preferred embodiment of the laser processing apparatus according to the present invention will now be described in detail with reference to the attached drawings. FIG. 1 is a perspective view of a laser processing apparatus 1 according to this preferred embodiment. The laser processing apparatus 1 shown in FIG. 1 includes a stationary base 2, a first chuck table mechanism 3 for holding a first workpiece, the first chuck table mechanism 3 being provided on the stationary base 2 so as to be movable in an X direction shown by an arrow X, a second chuck table mechanism 3' for holding a second workpiece, the second chuck table 3' being provided on the stationary base 2 in parallel to the first chuck table mechanism 3 so as to be movable in the X direction, and a laser beam applying unit 4 provided on the stationary base 2 in a central region defined between the first and second chuck table mechanisms 3 and 3'. A first laser mechanism 1a including the first chuck table mechanism 3 is formed on the front side as viewed in FIG. 1, and a second laser mechanism 1b including the second chuck table mechanism 3' is formed on the rear side as viewed in FIG. 1.

Figure 2:
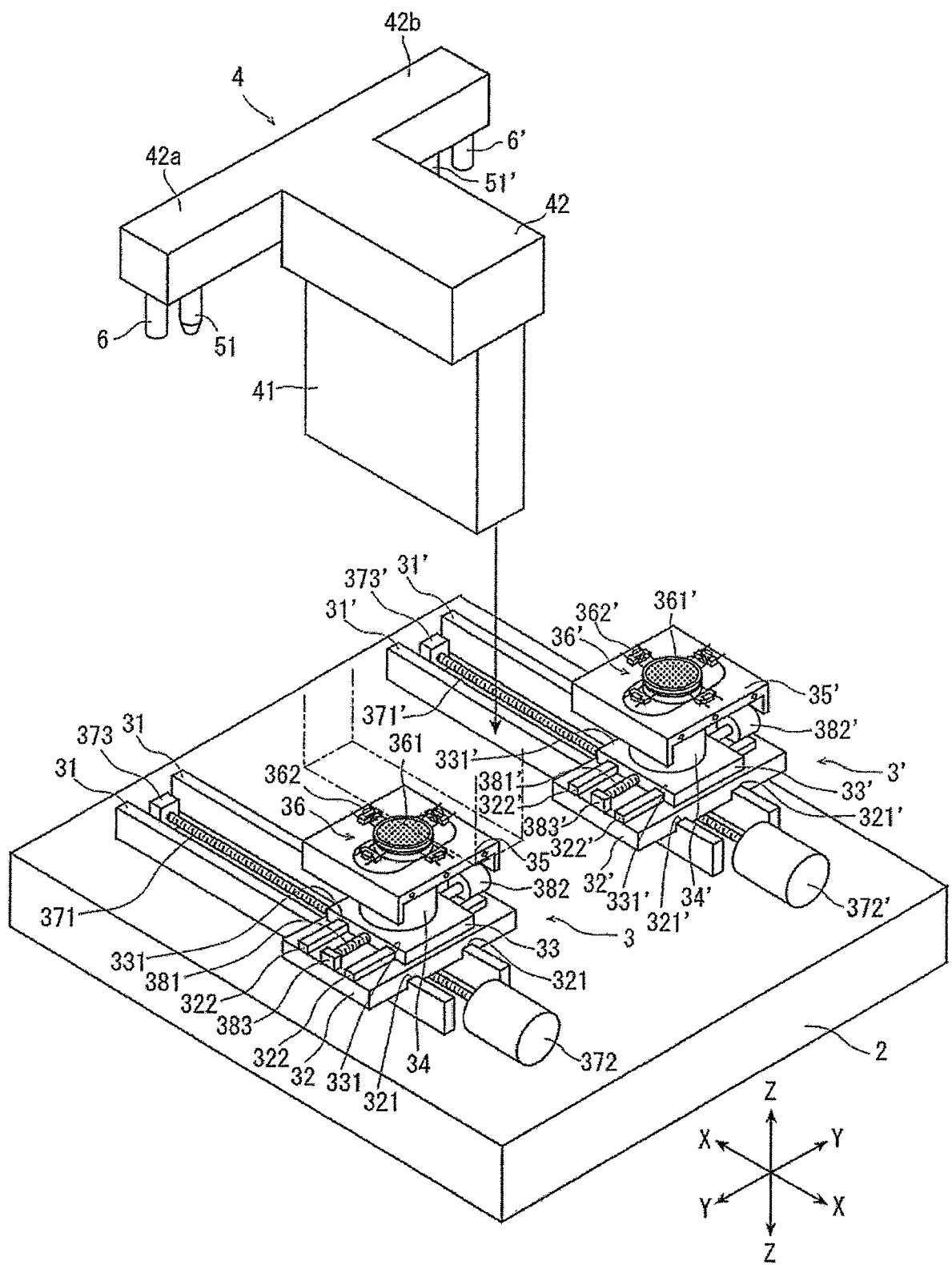
FIG. 2 is a perspective view showing an essential part of the laser processing apparatus shown in FIG. 1.

FIG. 2 is a perspective view for illustrating the structure of the laser processing apparatus 1 shown in FIG. 1 in detail. That is, FIG. 2 shows a condition obtained by demounting first and second cassette table mechanisms 7 and 7', first and second temporary setting means 8 and 8', first and second handling means 9 and 9', and first and second transfer means 10 and 10' from the stationary base 2. As shown in FIG. 2, the laser beam applying unit 4 is provided at a substantially central position on the stationary base 2, and the first chuck table mechanism 3 is provided on the front side of the laser beam applying unit 4 as viewed in FIG. 2. The first chuck table mechanism 3 includes a pair of parallel guide rails 31 provided on the stationary base 2 so as to extend in the X direction, a moving base 32 slidably provided on the guide rails 31 so as to be movable in the X direction, a slide block 33 slidably provided on the moving base 32 so as to be movable in a Y direction shown by an arrow Y perpendicular to the X direction, a cover table 35 supported by a cylindrical member 34 standing on the slide block 33, and a first chuck table 36 (first holding means) for holding the first workpiece. The first chuck table 36 has a vacuum chuck 361 formed of a porous material. The first workpiece is adapted to be held under suction on the upper surface of the vacuum chuck 361 as a holding surface by operating suction means (not shown). The first chuck table 36 is rotatable by a pulse motor (not shown) provided in the cylindrical member 34. The first chuck table 36 is provided with clamps 362 for fixing an annular frame F (see FIG. 1) supporting a semiconductor wafer W as the first workpiece through a protective tape T.

The lower surface of the moving base 32 is formed with a pair of guided grooves 321 for slidably engaging the pair of guide rails 31 mentioned above. A pair of parallel guide rails 322 are provided on the upper surface of the moving base 32 so as to extend in the Y direction. Accordingly, the moving base 32 is movable in the X direction along the guide rails 31 by the slidable engagement of the guided grooves 321 with the guide rails 31. The first chuck table mechanism 3 further includes first X moving means 37 for moving the moving base 32 in the X direction along the guide rails 31. The first X moving means 37 includes an externally threaded rod 371 extending parallel to the guide rails 31 so as to be interposed therebetween and a pulse motor 372 as a drive source for rotationally driving the externally threaded rod 371. The externally threaded rod 371 is rotatably supported at one end thereof to a bearing block 373 fixed to the stationary base 2 and is connected at the other end to the output shaft of the pulse motor 372 so as to receive the torque thereof. The externally threaded rod 371 is engaged with a tapped through hole formed in an internally threaded block (not shown) projecting from the lower surface of the moving base 32 at a central portion thereof. Accordingly, the moving base 32 is moved in the X direction along the guide rails 31 by operating the pulse motor 372 to normally or reversely rotate the externally threaded rod 371.

The first chuck table mechanism 3 is provided with X position detecting means (not shown) for detecting the X position of the first chuck table 36. The X position detecting means is so configured as to transmit a pulse signal of one pulse every 1 μm, for example, to control means (not shown). The control means counts the number of pulses as the pulse signal input from the X position detecting means to thereby detect the X position of the first chuck table 36. In the case that the pulse motor 372 is used as the drive source for the first X moving means 37 as in this preferred embodiment, the number of pulses as a drive signal output from the control means to the pulse motor 372 may be counted by the control means to thereby detect the X position of the first chuck table 36. In the case that a servo motor is used as the drive source for the first X moving means 37, a pulse signal output from a rotary encoder for detecting the rotational speed of the servo motor may be sent to the control means, and the number of pulses as the pulse signal input from the rotary encoder into the control means may be counted by the control means to thereby detect the X position of the first chuck table 36.

The lower surface of the slide block 33 is formed with a pair of guided grooves 331 for slidably engaging the pair of guide rails 322 provided on the upper surface of the moving base 32 as mentioned above. Accordingly, the slide block 33 is movable in the Y direction along the guide rails 322 by the slidable engagement of the guided grooves 331 with the guide rails 322. The first chuck table mechanism 3 further includes first Y moving means 38 for moving the slide block 33 in the Y direction along the guide rails 322. The first Y moving means 38 includes an externally threaded rod 381 extending parallel to the guide rails 322 so as to be interposed therebetween and a pulse motor 382 as a drive source for rotationally driving the externally threaded rod 381. The externally threaded rod 381 is rotatably supported at one end thereof to a bearing block 383 fixed to the upper surface of the moving base 32 and is connected at the other end to the output shaft of the pulse motor 382 so as to receive the torque thereof. The externally threaded rod 381 is engaged with a tapped through hole formed in an internally threaded block (not shown) projecting from the lower surface of the slide block 33 at a central portion thereof. Accordingly, the slide block 33 is moved in the Y direction along the guide rails 322 by operating the pulse motor 382 to normally or reversely rotate the externally threaded rod 381.

The first chuck table mechanism 3 is provided with Y position detecting means (not shown) for detecting the Y position of the first chuck table 36. The configuration of the Y position detecting means is similar to that of the X position detecting means mentioned above. That is, the Y position detecting means is so configured as to transmit a pulse signal of one pulse every 1 μm, for example, to the control means. The control means counts the number of pulses as the pulse signal input from the Y position detecting means to thereby detect the Y position of the first chuck table 36. In the case that the pulse motor 382 is used as the drive source for the first Y moving means 38 as in this preferred embodiment, the number of pulses as a drive signal output from the control means to the pulse motor 382 may be counted by the control means to thereby detect the Y position of the first chuck table 36. In the case that a servo motor is used as the drive source for the first Y moving means 38, a pulse signal output from a rotary encoder for detecting the rotational speed of the servo motor may be sent to the control means, and the number of pulses as the pulse signal input from the rotary encoder into the control means may be counted by the control means to thereby detect the Y position of the first chuck table 36.

As shown in FIG. 2, the second chuck table mechanism 3' is provided on the rear side of the laser beam applying unit 4 located in the central region of the stationary base 2. That is, the laser beam applying unit 4 is interposed between the first chuck table mechanism 3 and the second chuck table mechanism 3' in the Y direction. As similar to the first chuck table mechanism 3, the second chuck table mechanism 3' includes a second chuck table 36' (second holding means) for holding the second workpiece, second X moving means 37' for moving the second chuck table 36' in the X direction, and second Y moving means 38' for moving the second chuck table 36' in the Y direction. In FIG. 2, substantially the same parts as those of the first chuck table mechanism 3 are denoted by the same reference numerals with primes "'," and the operation of the second chuck table mechanism 3' is substantially the same as that of the first chuck table mechanism 3, so that detailed description thereof will be omitted herein.

The laser beam applying unit 4 includes a support member 41 provided on the stationary base 2 and a casing 42 supported to the support member 41. The casing 42 includes a pair of branch portions 42a and 42b horizontally extending toward the first and second chuck table mechanisms 3 and 3', respectively. An optical system constituting laser beam applying means 5 to be hereinafter described is stored in the branch portions 42a and 42b. A pair of first and second focusing means 51 and 51' constituting a part of the laser beam applying means 5 are provided on the branch portions 42a and 42b, respectively. Further, a pair of first and second imaging means 6 and 6' for detecting a target area to be laser processed are also provided on the branch portions 42a and 42b, respectively, wherein the first and second imaging means 6 and 6' are located in the vicinity of the first and second focusing means 51 and 51', respectively. Each of the first and second imaging means 6 and 6' includes illuminating means for illuminating a workpiece, an optical system for capturing an area illuminated by the illuminating means, and an imaging device (charge-coupled device (CCD)) for imaging the area captured by the optical system. An image signal output from each of the first and second imaging means 6 and 6' is transmitted to the control means.

Figure 3:
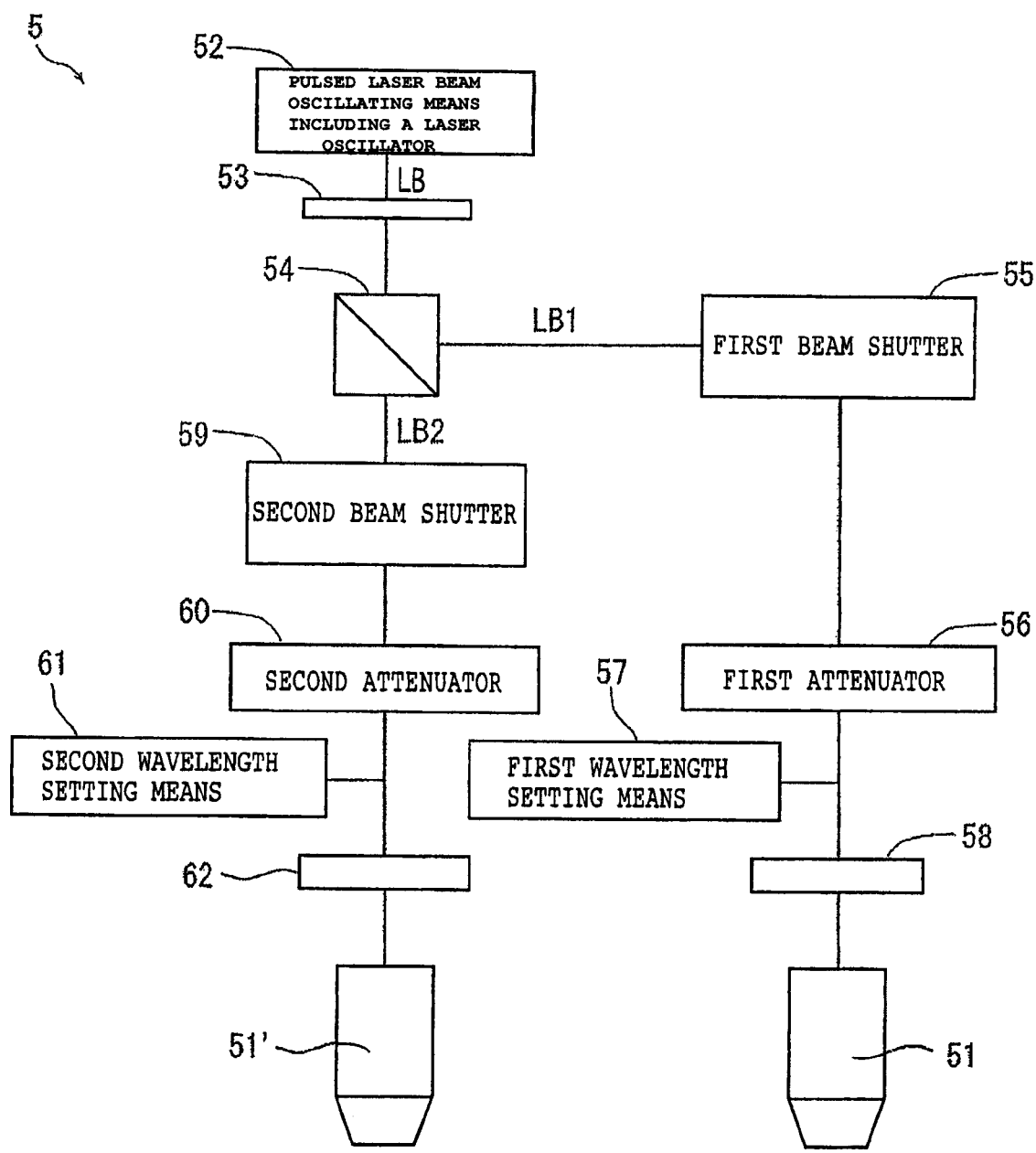
FIG. 3 is a block diagram of laser beam applying means included in the laser processing apparatus shown in FIG. 1.

The laser beam applying means 5 will now be described in more detail with reference to FIG. 3. The laser beam applying means 5 includes pulsed laser beam oscillating means 52, a half-wave plate 53 provided on an optical path to be branched, a polarization beam splitter 54, first and second beam shutters 55 and 59, first and second attenuators 56 and 60, first and second wavelength setting means 57 and 61, first and second half-wave plates 58 and 62 provided on first and second optical paths branched, and the first and second focusing means 51 and 51'.

The pulsed laser beam oscillating means 52 includes a laser oscillator and repetition frequency setting means (both not shown), wherein the pulsed laser beam oscillating means 52 oscillates a laser beam LB having a wavelength of 1064 nm and a repetition frequency of 50 kHz, for example. The laser beam LB is branched into a first laser beam LB1 (first optical path) and a second laser beam LB2 (second optical path) by the polarization beam splitter 54, wherein the first laser beam LB1 is S polarized light reflected by the polarization beam splitter 54, and the second laser beam LB2 is P polarized light transmitted through the polarization beam splitter 54.

The half-wave plate 53 is interposed between the pulsed laser beam oscillating means 52 and the polarization beam splitter 54. The rotational angle of the half-wave plate 53 is adjusted by rotational angle adjusting means (not shown), thereby allowing rotation of the polarization plane of the light emerging from the half-wave plate 53. Accordingly, by rotating the half-wave plate 53, the ratio in intensity between the first laser beam LB1 as S polarized light and the second laser beam LB2 as P polarized light to be output from the polarization beam splitter 54 can be continuously changed.

The first and second beam shutters 55 and 59 are provided on the optical paths of the first and second laser beams LB1 and LB2 output from the polarization beam splitter 54, respectively. Each of the first and second beam shutters 55 and 59 is provided with a shutter driving apparatus (not shown), wherein the first beam shutter 55 can be driven to a position where the first laser beam LB1 is interrupted and a position where the first laser beam LB1 is not interrupted, and the second beam shutter 59 can be driven to a position where the second laser beam LB2 is interrupted and a position where the second laser beam LB2 is not interrupted. Accordingly, the first and second beam shutters 55 and 59 can be operated so as to suitably select a mode where only the first laser beam LB1 is applied to the first workpiece, a mode where only the second laser beam LB2 is applied to the second workpiece, or a mode where both the first and second laser beams LB1 and LB2 are applied to the first and second workpieces.

The first and second laser beams LB1 and LB2 passed through the first and second beam shutters 55 and 59 are adjusted in intensity by the first and second attenuators 56 and 60, respectively. Each of the first and second attenuators 56 and 60 may be provided by a variable attenuator for a laser beam known in the art, wherein the laser intensity can be variably adjusted according to the processing conditions required for each workpiece.

The first and second wavelength setting means 57 and 61 are provided on the optical paths of the first and second laser beams LB1 and LB2 passed through the first and second attenuators 56 and 60, respectively. For example, the wavelength (1064 nm) of the laser beam oscillated from the laser beam oscillating means 52 can be converted into a wavelength of 532 nm by passing the laser beam through a nonlinear crystal or converted into a wavelength of 355 nm by passing the laser beam through a single crystal. The first and second wavelength setting means 57 and 61 can be operated so as to suitably select a mode where the transmission wavelength (1064 nm) to each workpiece is used to form a modified layer inside each workpiece or a mode where the absorption wavelength (355 nm) to each workpiece is used to perform ablation to the upper surface of each workpiece. Accordingly, by providing the first and second wavelength setting means 57 and 61 on the first and second optical paths, the wavelengths of the first and second laser beams LB1 and LB2 can be set different from each other.

The first and second half-wave plates 58 and 62 are provided on the optical paths of the first and second laser beams LB1 and LB2 passed through the first and second wavelength setting means 57 and 61, respectively. Each of the first and second half-wave plates 58 and 62 is provided with rotational drive means (not shown). Accordingly, the first half-wave plate 58 can be rotated to adjust the direction of the polarization plane of the first laser beam LB1 according to the material of the first workpiece. Similarly, the second half-wave plate 62 can be rotated to adjust the direction of the polarization plane of the second laser beam LB2 according to the material of the second workpiece.

The first and second laser beams LB1 and LB2 passed through the first and second half-wave plates 58 and 62 enter the first and second focusing means 51 and 51' provided at the ends of the first and second optical paths, respectively. Each of the first and second focusing means 51 and 51' includes a focusing lens. Accordingly, the first laser beam LB1 is focused to the first workpiece held on the first chuck table 36 by the focusing lens of the first focusing means 51. Similarly, the second laser beam LB2 is focused to the second workpiece held on the second chuck table 36' by the focusing lens of the second focusing means 51'.

The optical system of the laser beam applying means 5 mentioned above is stored in the branch portions 42a and 42b of the casing 42 located at the substantially central position on the stationary base 2 so as to be interposed between the first and second chuck table mechanisms 3 and 3'. The first and second focusing means 51 and 51' are provided at the ends of the branch portions 42a and 42b where the first and second focusing means 51 and 51' can be opposed to the first and second chuck tables 36 and 36', respectively. That is, the first and second focusing means 51 and 51' are located so as to be opposed to first and second processing areas where laser processing is performed to the first and second workpieces held on the first and second chuck tables 36 and 36', respectively.

In this preferred embodiment, each of the X and Y moving means mentioned above includes an externally threaded rod parallel to a pair of guide rails, an internally threaded block including a tapped through hole provided on the lower surface of a moving base or a slide block and threadedly engaged with the externally threaded rod, and a pulse motor as a drive source for rotationally driving the externally threaded rod. However, this configuration is merely illustrative. For example, each of the X and Y moving means may be provided by a so-called linear shaft motor including a linear rail extending in the X direction or the Y direction in place of the externally threaded rod and a coil movable element movably engaged with the linear rail in such a manner that the linear rail is inserted through the coil movable element, wherein the coil movable element is mounted on a moving base or a slide block above which a chuck table is provided.

Referring back to FIG. 1, there are provided on the stationary base 2 the first and second cassette table mechanisms 7 and 7' for mounting first and second cassettes 70 and 70' in which a plurality of first workpieces such as semiconductor wafers and a plurality of second workpieces such as semiconductor wafers are each stored, the first and second temporary setting means 8 and 8' for temporarily setting the first and second workpieces taken out of the first and second cassettes 70 and 70', the first and second handling means 9 and 9' for taking the first and second workpieces out of the first and second cassettes 70 and 70' before processing and for returning the first and second workpieces into the first and second cassettes 70 and 70' after processing, and the first and second transfer means 10 and 10' for transferring the first and second workpieces from the first and second temporary setting means 8 and 8' to the first and second chuck tables 36 and 36' before processing and for transferring the first and second workpieces from the first and second chuck tables 36 and 36' to the first and second temporary setting means 8 and 8' after processing.

Figure 4:
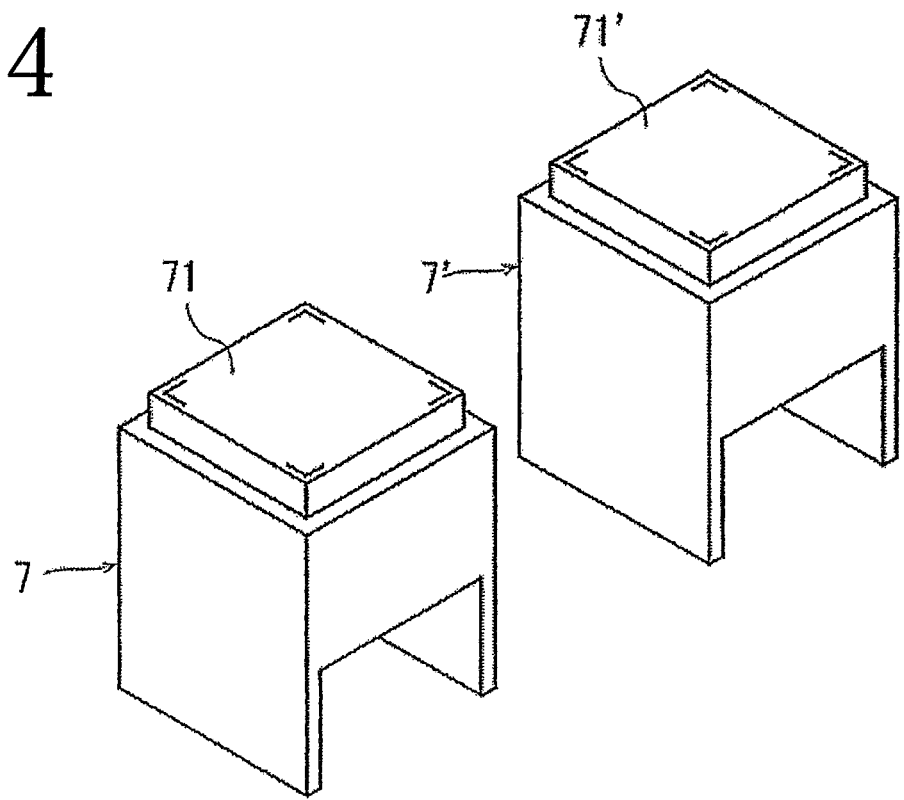
FIG. 4 is a perspective view of first and second cassette table mechanisms included in the laser processing apparatus shown in FIG. 1.

These cassette table mechanisms 7 and 7', temporary setting means 8 and 8', handling means 9 and 9', and transfer means 10 and 10' will now be described in detail. As shown in FIGS. 1 and 4, the first cassette table mechanism 7 is provided adjacent to a first standby area where the first workpiece is held on the first chuck table 36 of the first chuck table mechanism 3 before processing or unheld from the first chuck table 36 after processing. Similarly, the second cassette table mechanism 7' is provided adjacent to a second standby area where the second workpiece is held on the second chuck table 36' of the second chuck table mechanism 3' before processing or unheld from the second chuck table 36' after processing. The first and second cassette table mechanisms 7 and 7' include first and second cassette tables 71 and 71' for mounting the first and second cassettes 70 and 70', respectively. Each of the first and second cassette tables 71 and 71' is vertically movable by elevating means (not shown).

Figure 5:
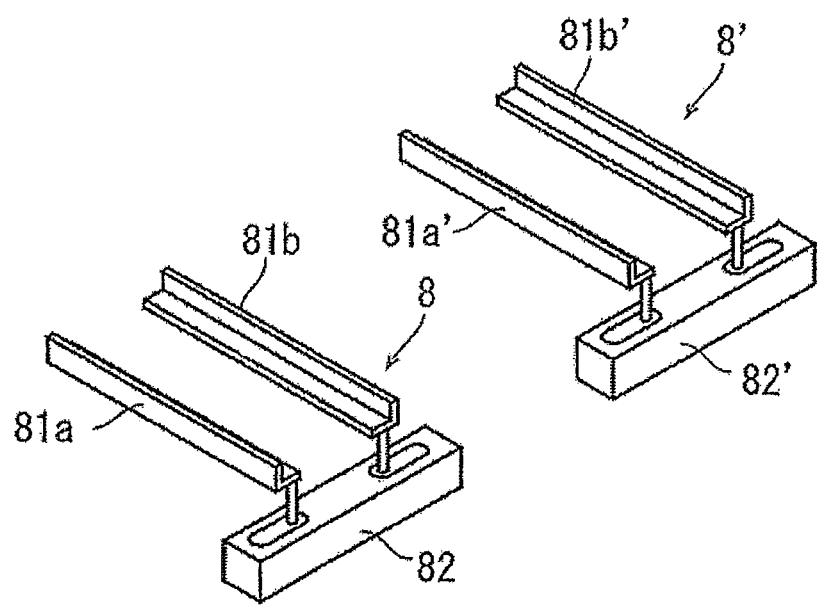
FIG. 5 is a perspective view of first and second temporary setting means included in the laser processing apparatus shown in FIG. 1.

The first and second temporary setting means 8 and 8' will now be described with reference to FIGS. 1 and 5. The first and second temporary setting means 8 and 8' are located adjacent to the first and second cassette table mechanisms 7 and 7' in the X direction, respectively. More specifically, the first temporary setting means 8 is located directly above the first standby area where the first workpiece is held or unheld with respect to the first chuck table 36. Similarly, the second temporary setting means 8' is located directly above the second standby area where the second workpiece is held or unheld with respect to the second chuck table 36'. As shown in FIG. 5, the first temporary setting means 8 includes a pair of parallel, sectionally L-shaped support rails 81*a* and 81*b* extending in the X direction and support rail moving means 82 for supporting end portions of the support rails 81*a* and 81*b* so as to allow the movement of the support rails 81*a* and 81*b* in the Y direction, thereby changing the spacing between the support rails 81*a* and 81*b*. Similarly, the second temporary setting means 8' includes a pair of parallel, sectionally L-shaped support rails 81*a'* and 81*b'* extending in the X direction and support rail moving means 82' for supporting end portions of the support rails 81*a'* and 81*b'* so as to allow the movement of the support rails 81*a'* and 81*b'* in the Y direction, thereby changing the spacing between the support rails 81*a'* and 81*b'*. The spacing between the support rails 81*a* and 81*b* is set so that when the support rails 81*a* and 81*b* are moved toward each other, this spacing becomes smaller than the outer diameter of the annular frame F supporting the semiconductor wafer W as the first workpiece through the protective tape T (more specifically, this spacing is the spacing between horizontal portions of the support rails 81*a* and 81*b*), whereas when the support rails 81*a* and 81*b* are moved away from each other, this spacing becomes larger than the outer diameter of the annular frame F. Similarly, the spacing between the support rails 81*a'* and 81*b'* is set so that when the support rails 81*a'* and 81*b'* are moved toward each other, this spacing becomes smaller than the outer diameter of the annular frame F supporting the semiconductor wafer W as the second workpiece through the protective tape T (more specifically, this spacing is the spacing between horizontal portions of the support rails 81*a'* and 81*b'*), whereas when the support rails 81*a'* and 81*b'* are moved away from each other, this spacing becomes larger than the outer diameter of the annular frame F.

Figure 6:
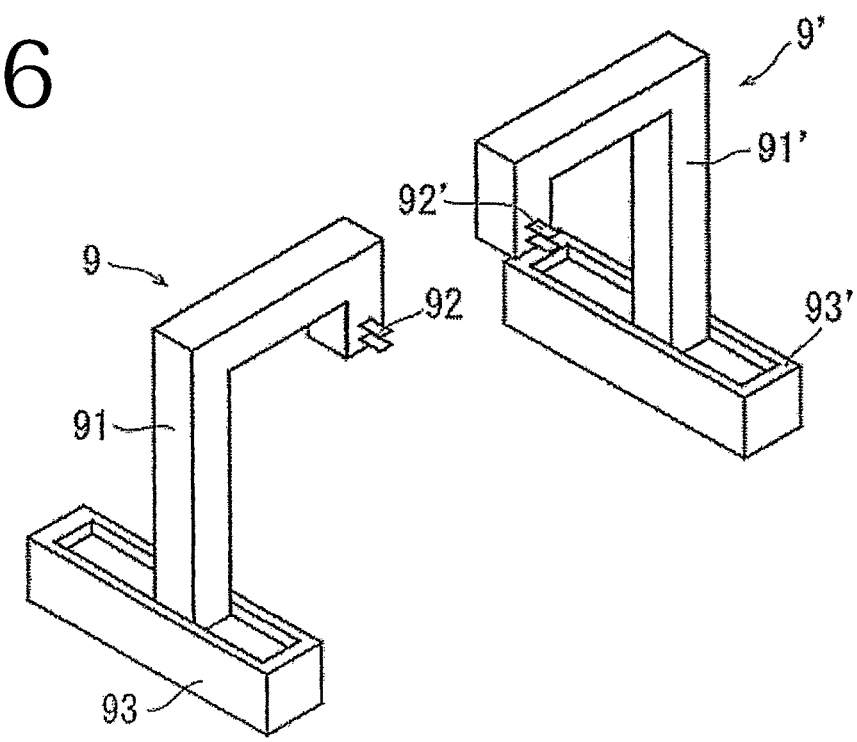
FIG. 6 is a perspective view of first and second handling means included in the laser processing apparatus shown in FIG. 1.

The first and second handling means 9 and 9' will now be described with reference to FIGS. 1 and 6. The first handling means 9 includes a handling arm 91, a catch member 92 provided at an end portion of the handling arm 91 on the side opposed to the first cassette table mechanism 7 for catching the annular frame F supporting the semiconductor wafer W as the first workpiece stored in the first cassette 70, and arm moving means 93 for supporting the handling arm 91 so as to allow the movement of the handling arm 91 in the X direction. Similarly, the second handling means 9' includes a handling arm 91', a catch member 92' provided at an end portion of the handling arm 91' on the side opposed to the second cassette table mechanism 7' for catching the annular frame F supporting the semiconductor wafer W as the second workpiece stored in the second cassette 70', and arm moving means 93' for supporting the handling arm 91' so as to allow the movement of the handling arm 91' in the X direction. Each of the catch members 92 and 92' is driven by air pressure supplied from an air cylinder (not shown), thereby catching the annular frame F.

Figure 7:
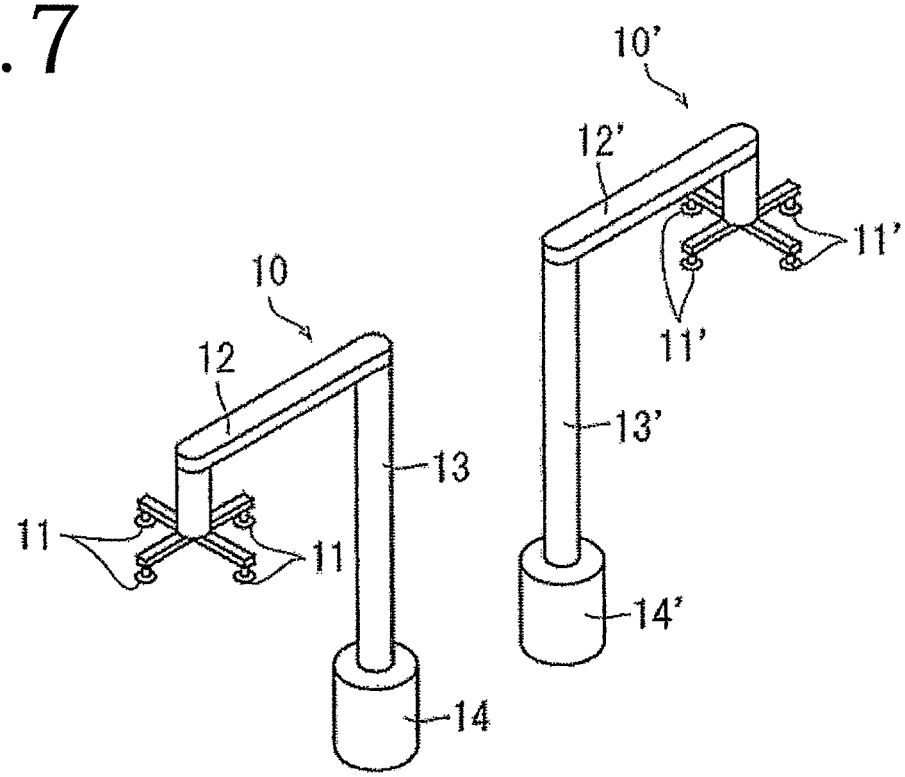
FIG. 7 is a perspective view of first and second transfer means included in the laser processing apparatus shown in FIG. 1.

The first and second transfer means 10 and 10' will now be described with reference to FIGS. 1 and 7. The first transfer means 10 includes a plurality of suction pads 11 for holding the annular frame F supporting the semiconductor wafer W as the first workpiece under suction, a transfer arm 12 having a front end where the suction pads 11 are located, an operating rod 13 for vertically moving the transfer arm 12, and elevating means 14 for vertically moving the operating rod 13. Similarly, the second transfer means 10' includes a plurality of suction pads 11' for holding the annular frame F supporting the semiconductor wafer W as the second workpiece under suction, a transfer arm 12' having a front end where the suction pads 11' are located, an operating rod 13' for vertically moving the transfer arm 12', and elevating means 14' for vertically moving the operating rod 13'. For example, each of the elevating means 14 and 14' is provided by an air piston. In this preferred embodiment, four suction pads 11 are supported to the transfer arm 12, and four suction pads 11' are supported to the transfer arm 12'. Each of the suction pads 11 and 11' is biased downward by a coil spring or the like and connected through a flexible pipe to a vacuum distributor (not shown), which is connected to suction means (not shown).

All of the laser beam applying means 5, the cassette table mechanisms 7 and 7', the temporary setting means 8 and 8', the handling means 9 and 9', and the transfer means 10 and 10' mentioned above are provided on the stationary base 2 as shown in FIG. 1. The operation of the first laser mechanism 1a including the first chuck table mechanism 3, a part of the laser beam applying means 5, the first cassette table mechanism 7, the first temporary setting means 8, the first handling means 9, and the first transfer means 10 will now be described with reference to FIG. 1 and FIGS. 8 to 11. The operation of the second laser mechanism 1b including the second chuck table mechanism 3', a part of the laser beam applying means 5, the second cassette table mechanism 7', the second temporary setting means 8', the second handling means 9', and the second transfer means 10' is substantially the same as that of the first laser mechanism 1a, and the detailed description thereof will be omitted herein.

Figure 8:
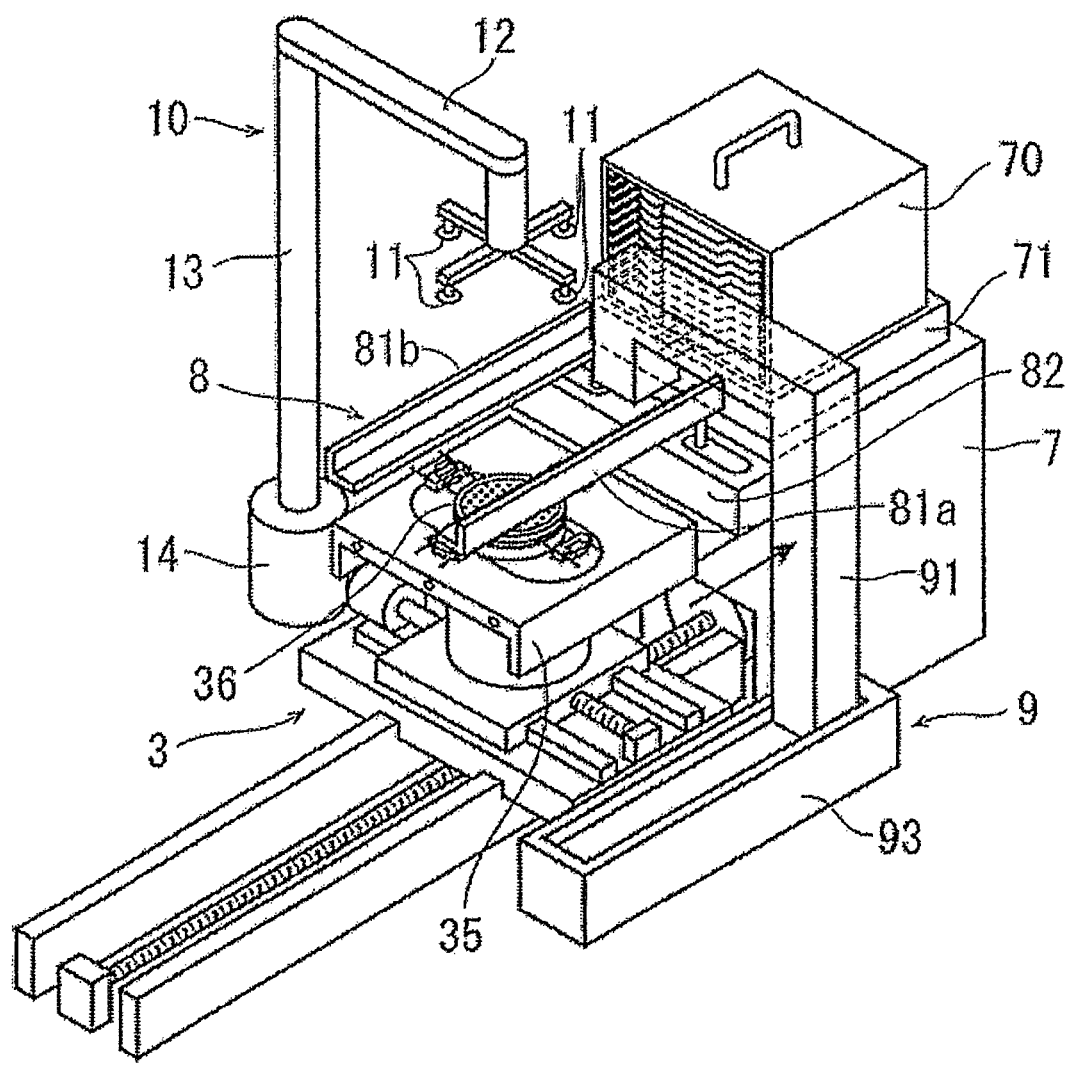
FIG. 8 is a perspective view showing a condition where the first handling means is positioned so as to take a semiconductor wafer out of a first cassette set on the first cassette table mechanism in the laser processing apparatus shown in FIG. 1.

As shown in FIGS. 1 and 8, the first cassette table mechanism 7 is located adjacent to the first chuck table mechanism 3 in the X direction. The first temporary setting means 8 is located directly above the first standby area where the first workpiece is held or upheld with respect to the first chuck table 36. The first handling means 9 is located on one side of the first standby area, i.e., on one side of the first temporary setting means 8 in the Y direction. The first transfer means 10 is located on the other side of the first standby area in the Y direction, i.e., on the side opposite to the first handling means 9 with respect to the first chuck table mechanism 3.

There will now be described a wafer setting step of taking the semiconductor wafer W as the first workpiece out of the first cassette 70 and then setting the semiconductor wafer W on the first chuck table 36. As shown in FIG. 8, the support rail moving means 82 of the first temporary setting means 8 is operated to move the support rails 81a and 81b toward each other, thereby reducing the spacing between the support rails 81a and 81b according to the outer diameter of the annular frame F supporting the semiconductor wafer W. Thereafter, the first cassette table 71 is vertically moved to adjust the height of the semiconductor wafer W stored in the first cassette 70 to the height of the catch member 92 of the first handling means 9 because the height of the catch member 92 is fixed.

Figure 9:
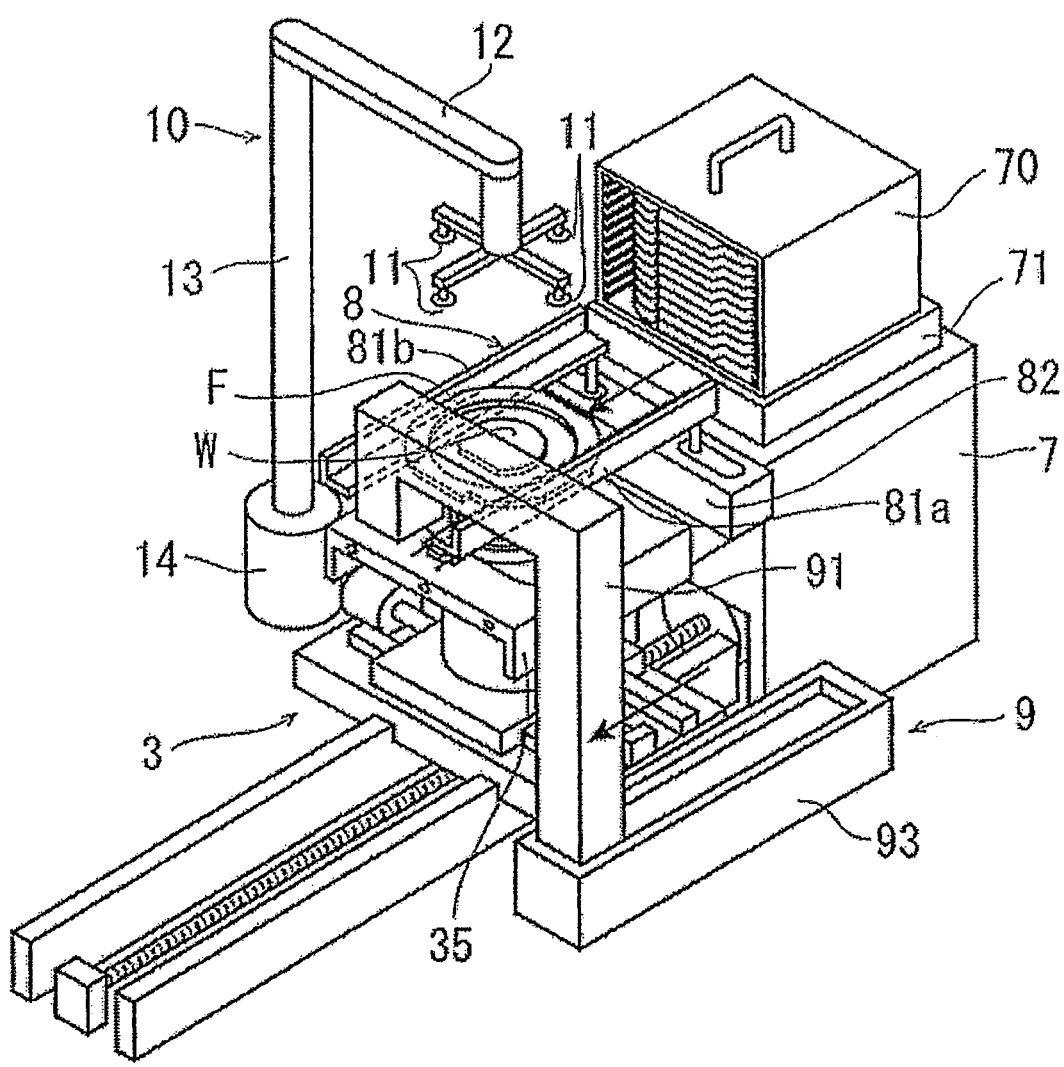
FIG. 9 is a view similar to FIG. 8, showing a condition where the semiconductor wafer handled by the first handling means is temporarily set on the first temporary setting means.

After adjusting the height of the semiconductor wafer W stored in the first cassette 70 to the height of the catch member 92, the handling arm 91 is moved toward the first cassette 70 until the catch member 92 comes into engagement with the annular frame F supporting the semiconductor wafer W stored in the first cassette 70. In this condition, the catch member 92 is driven by the air pressure supplied by the air cylinder (not shown), thereby catching the annular frame F. Thereafter, the arm moving means 93 is operated to move the handling arm 91 away from the first cassette table mechanism 7, thereby taking the semiconductor wafer W out of the first cassette 70 and carrying it to the support rails 81a and 81b of the first temporary setting means 8 as shown in FIG. 9. Thereafter, the operation of the catch member 92 catching the annular frame F is canceled to temporarily set the semiconductor wafer W on the support rails 81a and 81b.

After temporarily setting the semiconductor wafer W on the support rails 81a and 81b of the first temporary setting means 8, the elevating means 14 of the first transfer means 10 is operated to lower the operating rod 13. As described above, the transfer arm 12 having the suction pads 11 at the front end is connected to the upper end of the operating arm 13. Accordingly, when the operating rod 13 is lowered, the suction pads 11 provided at the front end of the transfer arm 12 come into abutment against the annular frame F supporting the semiconductor wafer W temporarily set on the first temporary setting means 8. As described above, each suction pad 11 is biased downward by a coil spring (not shown), so that when each suction pad 11 comes into abutment against the annular frame F, each suction pad 11 is moved slightly upward relative to the transfer arm 12. When the suction pads 11 come into abutment against the annular frame F, the lowering motion of the operating rod 13 is stopped and a vacuum is supplied through the vacuum distributor (not shown) to the suction pads 11, thereby holding the semiconductor wafer W through the annular frame F to the suction pads 11 under suction.

Figure 11:
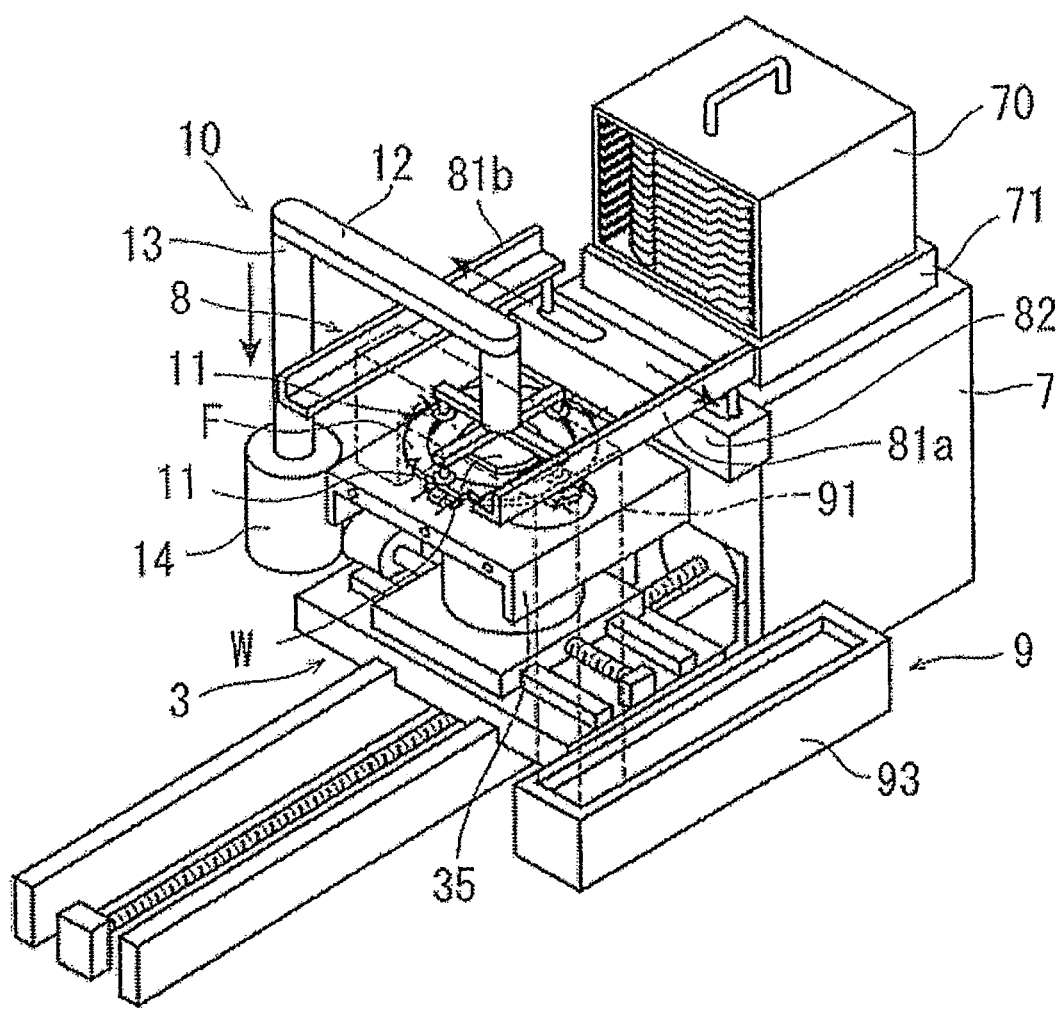
FIG. 11 is a view similar to FIG. 8, showing a condition where the semiconductor wafer held by the first transfer means is transferred and set on a first chuck table included in the laser processing apparatus shown in FIG. 1.

After holding the semiconductor wafer W through the annular frame F to the suction pads 11, the support rail moving means 82 of the first temporary setting means 8 is operated to increase the spacing between the support rails 81a and 81b to a size greater than the outer diameter of the annular frame F as shown in FIG. 11. Thereafter, the operating rod 13 is further lowered to place the semiconductor wafer W on the upper surface of the first chuck table 36 set in the first standby area. Further, the supply of the vacuum to the suction pads 11 is stopped and the operating rod 13 is next raised to the retracted position shown in FIG. 9. Thereafter, the suction means (not shown) is operated to hold the semiconductor wafer W through the protective tape T on the upper surface of the first chuck table 36 under suction. Thereafter, the clamps 362 are operated to fix the annular frame F to the first chuck table 36. Thereafter, the X moving means 37 of the first chuck table mechanism 3 is operated to move the first chuck table 36 to the first processing area directly below the first focusing means 51 of the laser beam applying unit 4.

Thus, the wafer setting step by the first laser mechanism 1a has been described. As described above, the second laser mechanism 1b has substantially the same configuration as that of the first laser mechanism 1a, and the operation of the second laser mechanism 1b is similar to that of the first laser mechanism 1a. That is, the second laser mechanism 1b includes the second chuck table mechanism 3', a part of the laser beam applying means 5, the second cassette table mechanism 7', the second temporary setting means 8', the second handling means 9', and the second transfer means 10'. Accordingly, the description of a wafer setting step by the second laser mechanism 1b will be omitted herein. All of the cassette table mechanisms 7 and 7', the temporary setting means 8 and 8', the handling means 9 and 9', and the transfer means 10 and 10' are controlled by control signals output from an output interface (not shown) included in the control means.

There will now be described a laser processing step by the first laser mechanism 1a.

When the first chuck table 36 holding the semiconductor wafer W is set in the first processing area, the first imaging means 6 and the control means perform an alignment step of detecting a target area of the semiconductor wafer W to be laser-processed. That is, the first imaging means 6 and the control means perform image processing such as pattern matching for making the alignment between the target lines extending in a first direction on the semiconductor wafer W and the first focusing means 51 of the laser beam applying means 5 for applying a laser beam along the target lines, thus performing the alignment step of detecting the target lines extending in the first direction. Similarly, this alignment step is performed for the other target lines extending in a second direction perpendicular to the first direction on the semiconductor wafer W, thereby detecting the target lines extending in the second direction.

After performing the alignment step to detect all of the target lines formed on the semiconductor wafer W held on the first chuck table 36, the first chuck table 36 is moved to position one end of a predetermined one of the target lines directly below the first focusing means 51. Thereafter, the focused spot of a pulsed laser beam to be focused by the focusing lens of the first focusing means 51 is set at a predetermined height inside the semiconductor wafer W, wherein the pulsed laser beam has a transmission wavelength to the semiconductor wafer W. Thereafter, the pulsed laser beam is applied from the first focusing means 51 to the semiconductor wafer W, and at the same time the first chuck table 36 is moved at a predetermined speed in the X direction shown in FIG. 1. When the other end of the predetermined target line has reached the position directly below the first focusing means 51, the application of the pulsed laser beam is stopped and the movement of the first chuck table 36 is also stopped. As a result, a modified layer is formed inside the semiconductor wafer W along the predetermined target line. After performing such laser processing along the predetermined target line, the Y moving means 38 is operated to move the first chuck table 36 in the Y direction, and the laser processing is repeated along all of the other target lines extending in the first direction. Thereafter, the laser processing is similarly performed along all of the target lines extending in the second direction. A laser processing step by the second laser mechanism 1*b* is substantially the same as that by the first laser mechanism 1*a* mentioned above, so the detailed description thereof will be omitted herein.

After finishing the laser processing step, the semiconductor wafer W held on the chuck table 36 is returned to the original position in the first cassette 70 in the following procedure reverse to that of the wafer setting step described with reference to FIGS. 8 to 11. That is, after processing the semiconductor wafer W in the first processing area, the first chuck table 36 holding the semiconductor wafer W is moved from the first processing area to the first standby area shown in FIG. 11 by operating the X moving means 37. Thereafter, the operating rod 13 of the first transfer means 10 is lowered until the suction pads 11 come into abutment against the annular frame F supporting the semiconductor wafer W held on the chuck table 36. Thereafter, a vacuum is applied to the suction pads 11 to hold the semiconductor wafer W under suction. Thereafter, the suction holding of the semiconductor wafer W is canceled and the fixed condition of the annular frame F by the clamps 362 is also canceled. Thereafter, the operating rod 13 is raised to a vertical position higher than the support rails 81*a* and 81*b* of the first temporary setting means 8.

Figure 10:
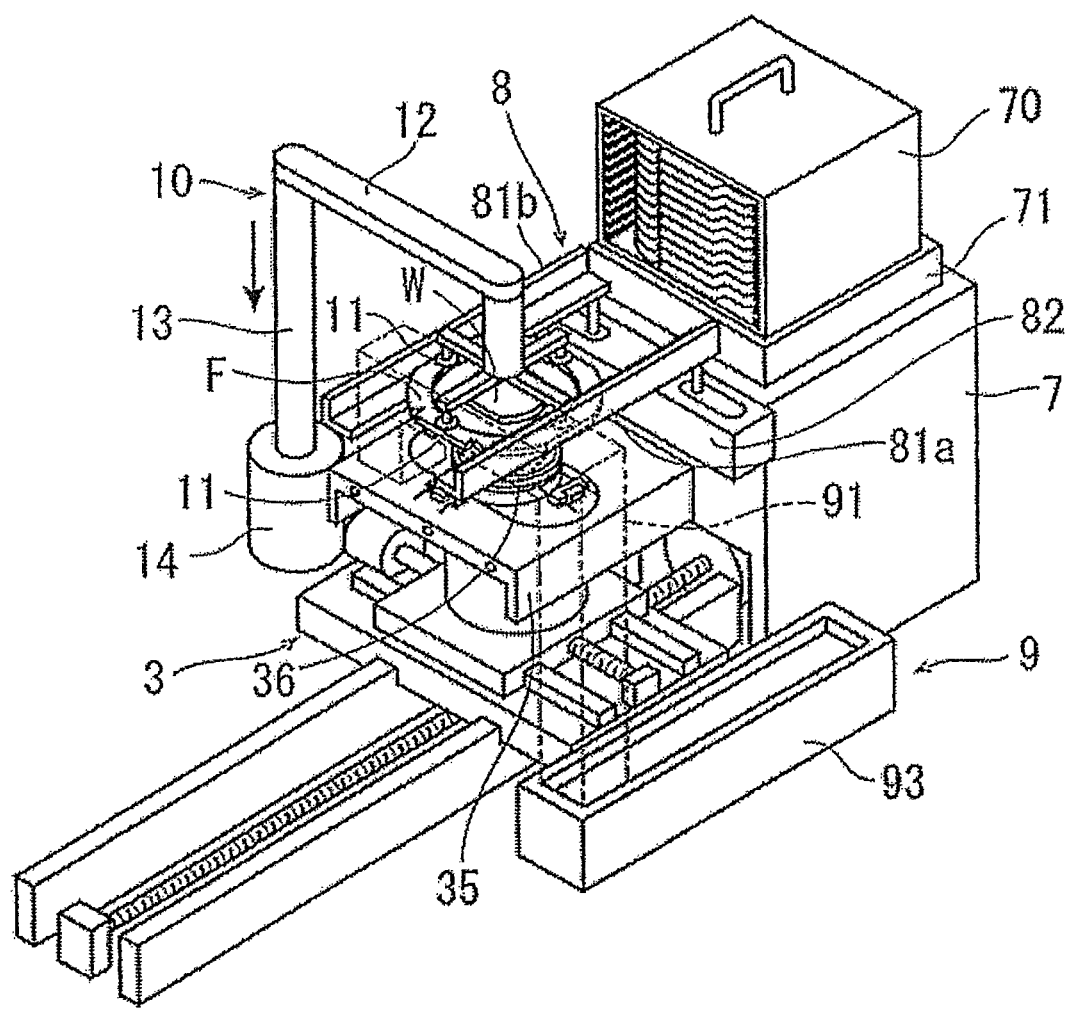
FIG. 10 is a view similar to FIG. 8, showing a condition where the semiconductor wafer temporarily set on the first temporary setting means is held by the first transfer means.

Thereafter, the support rail moving means 82 of the first temporary setting means 8 is operated to reduce the spacing between the support rails 81*a* and 81*b* according to the outer diameter of the annular frame F. Thereafter, the operating rod 13 of the first transfer means 10 is lowered to place the semiconductor wafer W held by the suction pads 11 onto the support rails 81*a* and 81*b* as shown in FIG. 10. Thereafter, the vacuum applied to the suction pads 11 is canceled to thereby temporarily set the semiconductor wafer W on the support rails 81*a* and 81*b*. Thereafter, the operating rod 13 is raised to the highest vertical position, i.e., the retracted position shown in FIG. 9.

Finally, the handling arm 91 of the first handling means 9 is moved from the position shown in FIG. 9 to the position shown in FIG. 8. At this time, the annular frame F supporting the semiconductor wafer W is pushed by the handling arm 91, so that the operation of the catch member 92 is not required. Thus, the semiconductor wafer W is pushed by the handling arm 91 and thereby returned to the original position in the first cassette 70 as shown in FIG. 8.

Figure 12:
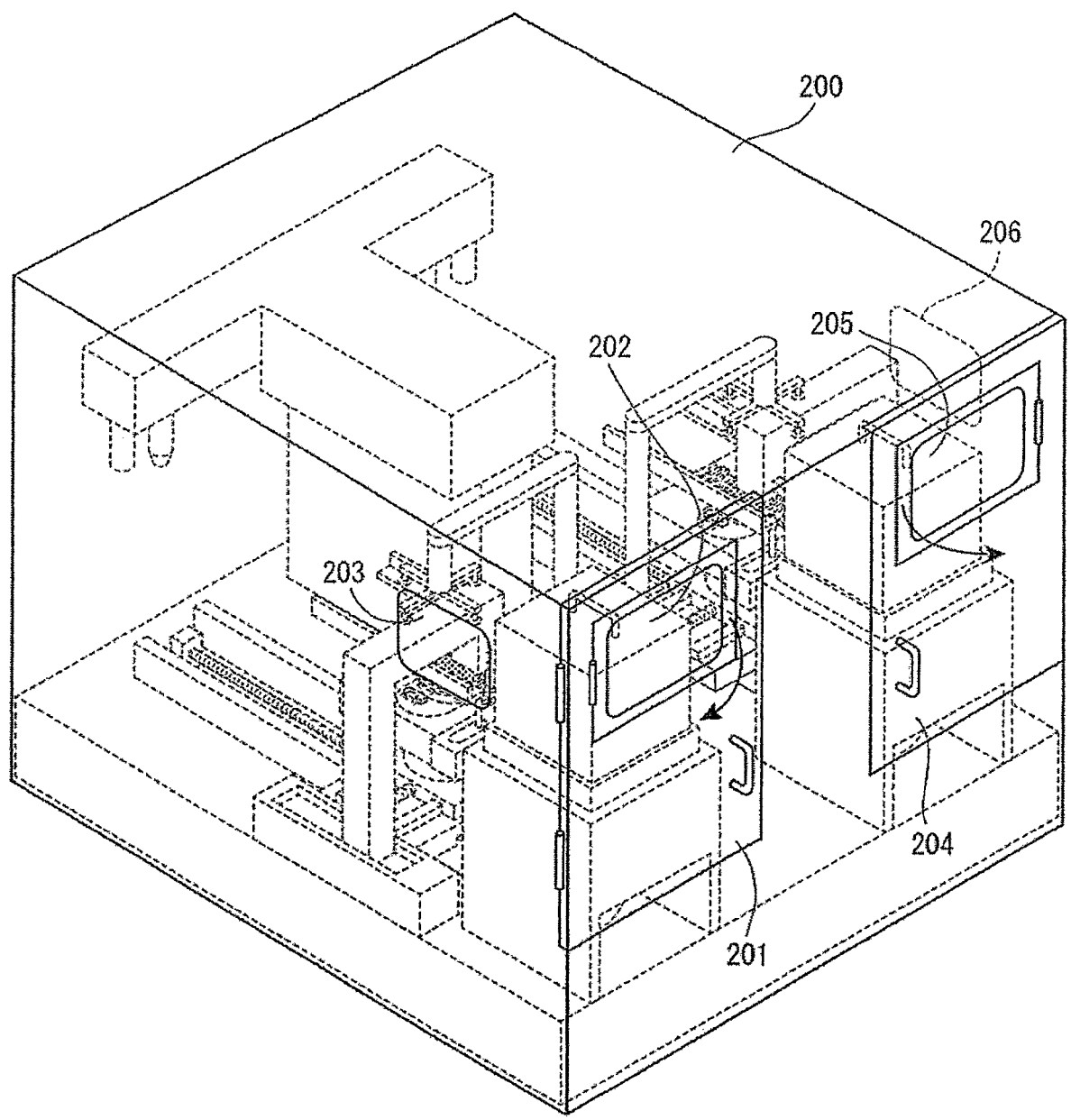
FIG. 12 is a perspective view showing a condition where the laser processing apparatus shown in FIG. 1 is enclosed by a housing.

As shown in FIG. 12, the laser processing apparatus 1 including the laser mechanisms 1*a* and 1*b* shown in FIG. 1 has a housing 200 for covering the laser mechanisms 1*a* and 1*b*. The housing 200 has a side wall opposed to the cassette table mechanisms 7 and 7' in the X direction (see FIG. 1). This side wall of the housing 200 is provided with a first door 201 opposed to the first cassette table mechanism 7 and a second door 204 opposed to the second cassette table mechanism 7'. The first and second doors 201 and 204 are arranged in parallel in the Y direction. The first and second doors 201 and 204 are configured like a so-called double door such that the first door 201 is adapted to open to the left and the second door 204 is adapted to open to the right as viewed in FIG. 12. When the first door 201 is opened, an operator can make access to the first standby area defined by the first cassette table mechanism 7 of the first laser mechanism 1*a* and the position where the first workpiece is held or upheld with respect to the first chuck table 36. Similarly, when the second door 204 is opened, the operator can make access to the second standby area defined by the second cassette table mechanism 7' of the second laser mechanism 1*b* and the position where the second workpiece is held or upheld with respect to the second chuck table 36'. That is, the first and second doors 201 and 204 are used in loading/unloading the first and second cassettes 70 and 70' to/from the first and second cassette tables 71 and 71', respectively.

The first door 201 is provided with a first operation panel 202 for operating the first laser mechanism 1*a*. Similarly, the second door 204 is provided with a second operation panel 205 for operating the second laser mechanism 1*b*. These operation panels 202 and 205 are adapted to be operated by the operator to conduct various kinds of setting to the control means. That is, the first laser mechanism 1*a* and the second laser mechanism 1*b* can be operated independently. Accordingly, there is no possibility that when the first door 201 is in an open condition in loading the first cassette 70 to the first cassette table 71, the operator may erroneously operate the first operation panel 202 to start the first laser mechanism 1*a*. Similarly, there is no possibility that when the second door 204 is in an open condition in loading the second cassette 70' to the second cassette table 71', the operator may erroneously operate the second operation panel 205 to start the second laser mechanism 1*b*.

The first operation panel 202 is pivotably mounted on the first door 201 so as to be opened to the left as viewed in FIG. 12. Similarly, the second operation panel 205 is pivotably mounted on the second door 204 so as to be opened to the right as viewed in FIG. 12. In the laser processing apparatus 1 according to this preferred embodiment, it is assumed that the operator operates the operation panels 202 and 205 as confirming the operations of the laser mechanisms 1*a* and 1*b*. Accordingly, the left side wall of the housing 200 is provided with a first inspection window 203 for allowing the operator to see the first laser mechanism 1a as shown in FIG. 12. Similarly, the right side wall of the housing 200 is provided with a second inspection window 206 for allowing the operator to see the second laser mechanism 1b. Accordingly, the operator can operate the first operation panel 202 in its open condition as seeing the first laser mechanism 1a through the first inspection window 203. Similarly, the operator can operate the second operation panel 205 in its open condition as seeing the second laser mechanism 1b through the second inspection window 206. By providing these inspection windows 203 and 206 and the operation panels 202 and 205, there is no possibility that the operation panels 202 and 205 may be confusingly operated in operating the first and second laser mechanisms 1a and 1b.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus comprising:
   a first laser mechanism including a first chuck table for holding a first workpiece, first X moving means for moving said first chuck table in an X direction, first Y moving means for moving said first chuck table in a Y direction perpendicular to said X direction, and first focusing means for focusing a first laser beam to said first workpiece held on said first chuck table;
   a second laser mechanism including a second chuck table for holding a second workpiece, second X moving means for moving said second chuck table in said X direction, second Y moving means for moving said second chuck table in said Y direction, and second focusing means for focusing a second laser beam to said second workpiece held on said second chuck table;
   a pulsed laser oscillator;
   a beam splitter for branching an original laser beam oscillated by said laser oscillator into said first laser beam and said second laser beam and leading said first and second laser beams to said first and second focusing means, respectively, wherein said beam splitter comprises a polarization beam splitter, and thus said first laser beam comprises S polarized light and said second laser beam comprises P polarized light;
   a half-wave plate interposed between said pulsed laser oscillator and said polarization beam splitter, wherein said half-wave plate is configured and arranged for adjusting a ratio of intensity between the S polarized light and the P polarized light;
   a first operation panel for setting first processing conditions for said first laser mechanism; and
   a second operation panel for setting second processing conditions for said second laser mechanism,
   wherein said first laser mechanism and said second laser mechanism are configured and arranged to be operated independently.

2. The laser processing apparatus according to claim 1, further comprising:
   a housing for covering said first laser mechanism and said second laser mechanism;
   said housing being provided with a first door at a position where said first workpiece is loaded to said first laser mechanism and a second door at a position where said second workpiece is loaded to said second laser mechanism;
   said first and second operation panels being mounted on said first and second doors, respectively;
   said first door and said second door being arranged in parallel in said Y direction on a plane perpendicular to said X direction.

3. The laser processing apparatus according to claim 2, wherein:
   said first chuck table is moved by said first X moving means between a first standby area where said first workpiece is held or unheld with respect to said first chuck table and a first processing area where said first laser beam is applied from said first focusing means to said first workpiece held on said first chuck table;
   said first standby area including a first cassette table for mounting a first cassette storing said first workpiece, first temporary setting means for temporarily setting said first workpiece, first handling means for taking said first workpiece out of said first cassette mounted on said first cassette table and then carrying said first workpiece to said first temporary setting means, and first transfer means for transferring said first workpiece from said first temporary setting means to said first chuck table;
   said first door being opened in loading/unloading said first cassette to/from said first cassette table; and
   said second chuck table is moved by said second X moving means between a second standby area where said second workpiece is held or unheld with respect to said second chuck table and a second processing area where said second laser beam is applied from said second focusing means to said second workpiece held on said second chuck table;
   said second standby area including a second cassette table for mounting a second cassette storing said second workpiece, second temporary setting means for temporarily setting said second workpiece, second handling means for taking said second workpiece out of said second cassette mounted on said second cassette table and then carrying said second workpiece to said second temporary setting means, and second transfer means for transferring said second workpiece from said second temporary setting means to said second chuck table;
   said second door being opened in loading/unloading said second cassette to/from said second cassette table.

4. The laser processing apparatus of claim 1, further comprising:
   a first beam shutter provided in the optical path of the first laser beam; and
   a second beam shutter provided in the optical path of the second laser beam.

5. The laser processing apparatus according to claim 4, wherein said first and second beam shutters are configured and arranged such that said first and second laser mechanisms can be operated in any one of the three following modes:
   a first mode in which only said first laser beam is applied to the first workpiece, and said second laser beam is not applied to the second workpiece;
   a second mode in which only said second laser beam is applied to the second workpiece, and said first laser beam is not applied to the first workpiece; and
   a third mode in which said first laser beam is applied to the first workpiece and said second laser beam is applied to the second workpiece.

6. The laser processing apparatus according to claim 1, wherein said first and second laser mechanisms are configured and arranged to be operated in any one of the three following modes:

a first mode in which only said first laser beam is applied to the first workpiece, and said second laser beam is not applied to the second workpiece;

a second mode in which only said second laser beam is applied to the second workpiece, and said first laser beam is not applied to the first workpiece; and a third mode in which said first laser beam is applied to the first workpiece and said second laser beam is applied to the second workpiece.

7. The laser processing apparatus according to claim 1, wherein said pulsed laser oscillator oscillates a laser beam having a wavelength of 1064 nm.

8. The laser processing apparatus according to claim 1, further comprising:

a first attenuator provided on said first laser beam between said polarization beam splitter and said first focusing means; and a second attenuator provided on said second laser beam between said polarization beam splitter and said second focusing means.

9. The laser processing apparatus according to claim 1, further comprising:

a first wavelength setting means provided on said first laser beam between said polarization beam splitter and said first focusing means; and a second wavelength setting means provided on said second laser beam between said polarization beam splitter and said second focusing means.

\* \* \* \* \*